US010452477B2

(12) United States Patent
Hussain et al.

(10) Patent No.: US 10,452,477 B2
(45) Date of Patent: Oct. 22, 2019

(54) MULTIPLE NODE REPAIR USING HIGH RATE MINIMUM STORAGE REGENERATION ERASURE CODE

(71) Applicant: NetApp, Inc., Sunnyvale, CA (US)

(72) Inventors: Syed Abid Hussain, Bangalore (IN); Srinivasan Narayanamurthy, Chennai (IN)

(73) Assignee: NETAPP, INC., Sunnyvale, CA (US)

( * ) Notice: Subject to any disclaimer, the term of this patent is extended or adjusted under 35 U.S.C. 154(b) by 83 days.

(21) Appl. No.: 15/248,047

(22) Filed: Aug. 26, 2016

(65) Prior Publication Data

US 2018/0060169 A1    Mar. 1, 2018

(51) Int. Cl.
| | | |
|---|---|---|
| G06F 11/10 | (2006.01) | |
| H03M 13/15 | (2006.01) | |
| G06F 3/06 | (2006.01) | |
| H03M 13/03 | (2006.01) | |
| H03M 13/13 | (2006.01) | |
| H03M 13/37 | (2006.01) | |

(52) U.S. Cl.
CPC .......... *G06F 11/1076* (2013.01); *G06F 3/064* (2013.01); *G06F 3/067* (2013.01); *G06F 3/0619* (2013.01); *H03M 13/03* (2013.01); *H03M 13/134* (2013.01); *H03M 13/154* (2013.01); *H03M 13/373* (2013.01)

(58) Field of Classification Search
None
See application file for complete search history.

(56) References Cited

U.S. PATENT DOCUMENTS

| | | | | |
|---|---|---|---|---|
| 8,156,368 B2* | 4/2012 | Chambliss | .......... | G06F 11/1092 711/162 |
| 8,631,269 B2* | 1/2014 | Vinayak | .............. | G06F 11/1662 714/4.11 |
| 8,694,866 B2* | 4/2014 | Tamo | .................. | G06F 11/1092 714/770 |

(Continued)

OTHER PUBLICATIONS

Chan J.C.W., et al., "Parity Logging with Reserved Space: Towards Efficient Updates and Recovery in Erasure-coded Clustered Storage," the 12th USENIX Conference on File and Storage Technologies (FAST 2014), Santa Clara, CA, Feb. 2014, 14 pages, URL: http://ansrlab.cse.cuhk.edu.hk/software/codfs/.

(Continued)

*Primary Examiner* — Justin R Knapp
(74) *Attorney, Agent, or Firm* — Haynes and Boone, LLP

(57) ABSTRACT

A distributed storage system can use a high rate MSR erasure code to repair multiple nodes when multiple node failures occur. An encoder constructs m r-ary trees to determine the symbol arrays for the parity nodes. These symbol arrays are used to generate the parity data according to parity definitions or parity equations. The m r-ary trees are also used to identify a set of recovery rows across helper nodes for repairing a systematic node. When failed systematic nodes correspond to different ones of the m r-ary trees, a decoder may select additional recovery rows. The decoder selects additional recovery rows when the parity definitions do not provide a sufficient number of independent linear equations to solve the unknown symbols of the failed nodes. The decoder can select recovery rows contiguous to the already identified recovery rows for access efficiency.

20 Claims, 7 Drawing Sheets

(56) References Cited

U.S. PATENT DOCUMENTS

| | | | |
|---|---|---|---|
| 2006/0170571 A1 | 8/2006 | Martinian et al. | |
| 2012/0054576 A1 | 3/2012 | Gross et al. | |
| 2012/0054585 A1 | 3/2012 | Jiang et al. | |
| 2012/0266050 A1 | 10/2012 | Cideciyan et al. | |
| 2015/0303949 A1* | 10/2015 | Jafarkhani | H03M 13/617 714/764 |

OTHER PUBLICATIONS

International Search Report and Written Opinion for Application No. PCT/US2016/067380 dated Mar. 30, 2017, 20 pages.

Tamo I., et al., "Access vs. Bandwidth in Codes for Storage," Information Theory Proceedings (ISIT), 2012 IEEE International Symposium on, Jul. 2012, pp. 1187-1191.

Agarwal et al., "An Alternate Construction of an Access-Optimal Regenerating Code with Optimal Sub-Packetization Level," arXiv:1501.04760v1, Jan. 2015, 6 pages.

Cadambe et al., "Polynomial Length MDS Codes With Optimal Repair in Distributed Storage," 2011 Conference Record of the Forty Fifth Asilomar Conference on Signals, Systems and Computers (ASILOMAR), Nov. 2011, 7 pages.

Dimakis et al., "Network Coding for Distributed Storage Systems," IEEE Transactions on Information Theory, vol. 56, No. 9, Sep. 2010, 13 pages.

Goparaju et al., "An Improved Sub-Packetization Bound for Minimum Storage Regenerating Codes," arXiv:1305.3498v1, May 2013, 13 pages.

Goparaju et al., "Minimum Storage Regenerating Codes for All Parameters," arXiv:1602.04496v1, Feb. 2016, 9 pages.

Rashmi et al., "Having Your Cake and Eating It Too: Jointly Optimal Erasure Codes for I/O, Storage, and Network-bandwidth," 13th USENIX Conference on File and Storage Technologies (FAST 15), Feb. 2015, 15 pages.

Raviv et al., "Access-Optimal MSR Codes with Optimal Sub-Packetization over Small Fields," arXiv:1505.0091v1, May 2015, 20 pages.

Sasidharan et al., "A High-Rate MSR Code With Polynomial Sub-Packetization Level," arXiv:1501.06662v1, Jan. 2015, 5 pages.

Tamo et al., "Access vs. Bandwidth in Codes for Storage," arXiv:1303.3668v1, Mar. 2013, 13 pages.

Wang et al., "Long MDS Codes for Optimal Repair Bandwidth," IEEE International Symposium on Information Theory Proceedings (ISIT), Jul. 2012, 5 pages.

International Search Report and Written Opinion for Application No. PCTAJS2017/048963 dated Dec. 13, 2017, 9 pages.

International Preliminary Report on Patentablility for Application No. PCT/US2017/048963 dated Feb. 26, 2019, 6 pages.

* cited by examiner

MULTIPLE NODE REPAIR USING HIGH RATE MINIMUM STORAGE REGENERATION ERASURE CODE

BACKGROUND

The disclosure generally relates to the field of distributed storage systems, and more particularly to data repair in distributed storage systems.

Distributed storage systems can use replication type redundancy for data resilience (i.e., creating and maintaining duplicates of data) or erasure coding type redundancy which has greater storage efficiency. Erasure coding for a distributed storage system involves splitting a data unit (e.g., a file) of size B into x chunks, each of the same size B/x. An erasure code is then applied to generate parity information, which introduces some redundancy of the file. The encoding results in n fragments of the file when the parity information fragments are included. The erasure code applied to the data is denoted as (n, k), where n represents the total number of nodes across which all fragments will be stored and k represents the number of systematic nodes (i.e., nodes that store only systematic data or non-parity information). The number of parity nodes (i.e., nodes that store parity information) is n−k=r.

With the substantial increase in the amount of data being stored, research into erasure codes seeks to optimize this storage efficiency along with reliability. Some of this research has explored a class of erasure codes referred to as maximum distance separable (MDS) codes (e.g., Reed Solomon codes). Since a distributed storage system will suffer erasures (e.g., storage node failures) due to various reasons (e.g., lower cost, unreliable storage nodes), research attempts to address the problem/cost of data transmission across a network to recover from an erasure and of the amount of data stored at each node, which has been referred to as a "repair problem." Research into this repair problem has led to "regeneration codes" or "regenerating codes." These codes are erasure codes which allow for repair of a failed node more efficiently than a traditional erasure code. Regenerating codes satisfy the expression:

$B \leq \Sigma_{i=0}^{k-1} \min\{\alpha,(d-i)\beta\}$ (Equation 1) (in the case of a functional-repair), with the parameters defined as:

B=total size of the source data to be stored, in terms of number of symbols;

α=storage capacity of each node, in terms of number of symbols;

k=the source data is recoverable from the data in any k nodes;

d and β=on failure of a node, the replacement node connects to any d of the existing nodes, downloading at-most β symbols from each of them; and dβ=repair bandwidth.

The curve ("optimal storage-bandwidth tradeoff curve") defined by equation 1 shows that both α and β cannot be simultaneously minimized. Thus, regenerating codes corresponding to the extremal points on the tradeoff curve are referred to as minimum storage regenerating (MSR) codes and minimum bandwidth regenerating (MBR) codes. An MSR code is an MDS code that minimizes the amount of storage space consumption per node (i.e., α). For an MSR code, the repair bandwidth is expressed by:

$$d\beta = \alpha + (k-1)\beta, \text{ where } \alpha = \frac{B}{k}.$$ (Equation 2)

An MBR code is a code that minimizes repair bandwidth. For an MBR code, the repair bandwidth is expressed as dβ=α.

The "code rate" for an (n, k) erasure code is defined as k/n or k/(k+r), which represents the proportion of the systematic data in the total amount of stored data (i.e., systematic data plus parity data). An erasure code having a code rate k/n>0.5 is referred to as a high rate erasure code. This means that the coding scheme will require a relatively large amount of systematic nodes k as compared to parity nodes r. Conversely, a low-rate (k/n≤0.5) erasure code will require a relatively small amount of systematic nodes k as compared to parity nodes r. High-rate erasure codes can be desirable because they require less storage overhead than low-rate erasure codes for a given set of systematic data.

BRIEF DESCRIPTION OF THE DRAWINGS

Embodiments of the disclosure may be better understood by referencing the accompanying drawings.

DESCRIPTION

Figure 1:
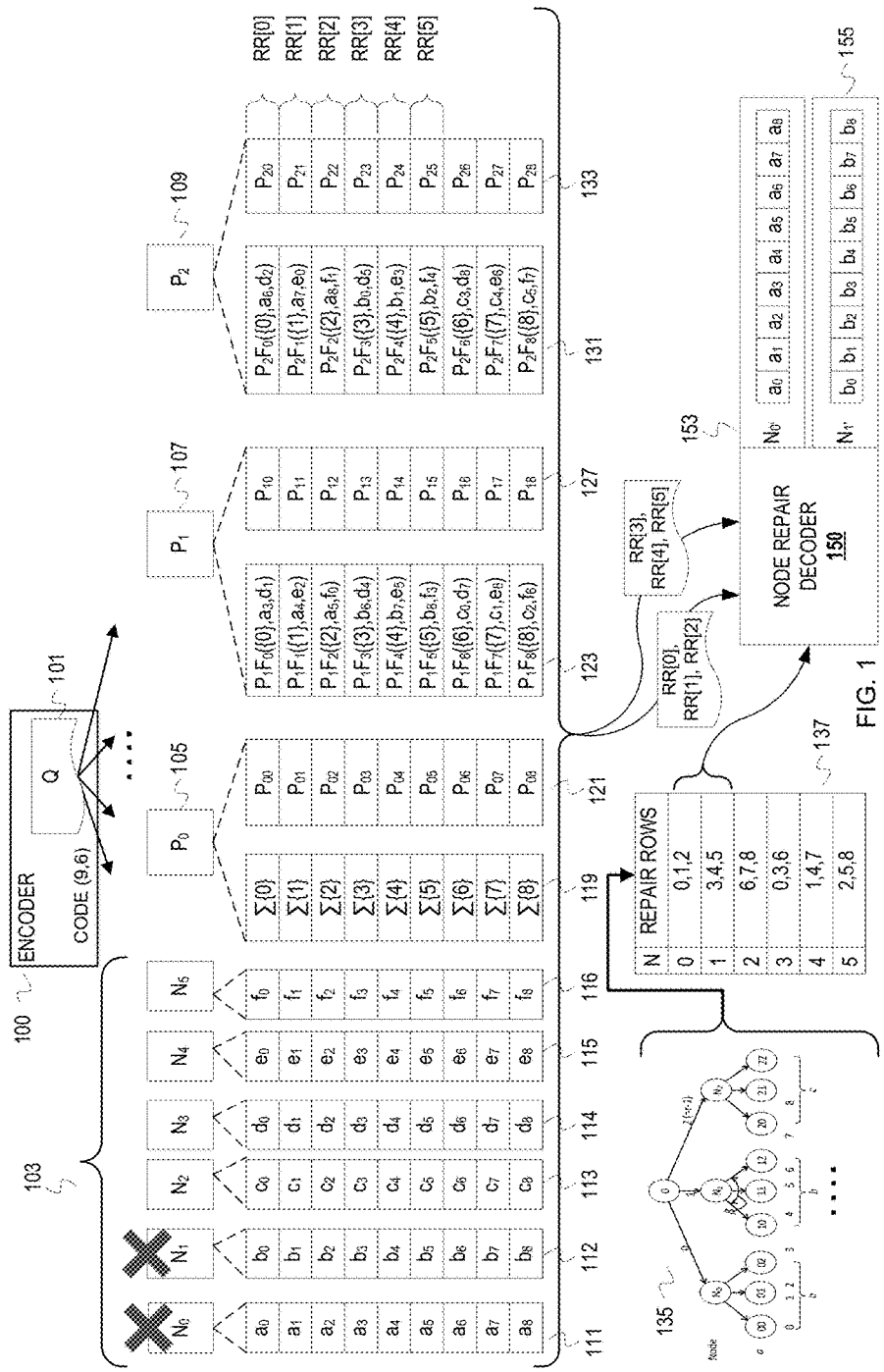
FIG. 1 depicts a diagram of repairing two failed nodes in a distributed storage system using a high rate MSR erasure code.

The description that follows includes example systems, methods, techniques, and program flows that embody aspects of the disclosure. However, it is understood that this disclosure may be practiced without these specific details. For instance, this disclosure refers to failures of storage nodes in illustrative examples. A node "failure" does not necessarily mean that data has been lost on the storage node (e.g., data corruption or node damage). A node failure may be a loss of connectivity that prevents availability of the data at the storage node within a particular time period that would violate a data availability guarantee. In other instances, well-known instruction instances, protocols, structures and techniques have not been shown in detail in order not to obfuscate the description.

Terminology

This disclosure uses the term "symbol" since it is the term used in literature when discussing error correcting codes. In practical applications of error correcting codes, a symbol corresponds to a unit of data. For instance, a file of 162 megabytes (MB) to be stored across 9 storage nodes, each having a capacity sufficient to store 1 MB of symbols, would be described as being of a size 162 symbols. And the storage nodes are described as each having capacity sufficient for 18 symbols.

This disclosure also uses the term "storage node." A storage node corresponds to a logically or physically distinct storage unit that can host data. For example, a storage node may be an individual storage medium (e.g., a disk), a storage device (e.g., a flash storage drive), a virtual disk, a group of storage devices, etc. For instance, a storage node can be a bank of flash storage devices managed by and accessed through a storage controller. A "replacement" storage node can be a storage node that is already a member of the storage system or a storage node added to the storage system. Adding a storage node to a storage system can include provisioning, deploying, and/or configuring a storage node. As an example, a replacement storage node can involve provisioning, configuring, and deploying a storage node from a cloud storage provider.

The description also distinguishes between systematic storage nodes and parity storage nodes. Systematic storage nodes are storage nodes that host systematic symbols, which are a part of the source data and do not include parity information. Parity storage nodes are storage nodes that host parity information. Parity information on a parity storage node or parity node at least include a parity definition (i.e., a system of linear equations or expressions for computing an unknown symbol(s) from systematic symbols) and parity symbols (i.e., a result for each of the parity definitions).

Introduction

In an MSR coding scheme, each systematic node stores $\alpha$ symbols that form a source data fragment. The number of symbols ($\alpha$) at each node is referred to as the "sub-packetization level." As previously mentioned, an MSR code allows node repair with $\beta$ symbols from each surviving node ("helper node"), where $\beta$ is a subset of the $\alpha$ symbols. Research has shown the lower bound for $\alpha$ to be $r^m$, wherein m=k/r. Although research is active, the research focuses on single node repair. As the nodes in large scale distributed storage systems age and utilization of unreliable storage devices/media increases, the likelihood of multiple node failures also increases.

Overview

A distributed storage system can use a high rate MSR erasure code to repair multiple nodes when multiple node failures occur. An encoder constructs m r-ary trees to determine the symbol arrays for the parity nodes. These symbol arrays are used to generate the parity data according to parity definitions or parity equations. The m r-ary trees are also used to identify a set of "recovery rows" across helper nodes for repairing a systematic node and recovering the symbols thereof. The set of recovery rows for a failed systematic node identifies, by indexes, sets of symbols across helper nodes and corresponding parity information for systematic node repair. When multiple systematic nodes fail, a decoder combines the sets of recovery rows of the failed nodes for symbol recovery if the failed nodes are represented in a same one of the m r-ary trees. However, when the failed systematic nodes correspond to different ones of the m r-ary trees, a decoder selects additional recovery rows. The decoder selects additional recovery rows because the sets of recovery rows of systematic nodes represented in different ones of the m r-ary trees overlap to some extent. With overlapping of recovery rows, the combined sets of recovery rows do not provide sufficient parity expressions to form a complete set of linearly independent equations. The decoder can select additional repair rows contiguous to the already identified repair rows for access efficiency.

Example Illustrations

FIG. 1 depicts a diagram of repairing two failed nodes in a distributed storage system using a high rate MSR erasure code. The example presumes an MSR code (9,6), which means the total number of storage nodes is n=9; the number of systematic storage nodes is k=6; the number of parity storage nodes is r=3, and the ratio of systematic storage nodes to parity storage nodes is k/r=m=2. A large scale entire distributed storage system is not depicted due to space constraints of the drawings sheets, but n storage nodes are depicted for hosting n fragments of a file 101 of size Q symbols. The n storage nodes include systematic storage nodes 103 individually identified as $N_0$-$N_5$ and parity storage nodes $P_0$-$P_2$. Using the lower bound for an access optimal MSR erasure code ($\alpha=r^m$), each file fragment (or chunk) is split into 9 symbols ($9=\alpha=r^m=3^2$). Thus, $Q=k*\alpha$. The symbols are indexed 0-8. The fragments are fragments a-f. A codeword of the considered High Rate MSR code contains $(k+r)*\alpha$ symbols/chunks of the file 101.

An encoder 100 of the distributed storage system encodes the file 101 into the systematic symbols and parity symbols according to the erasure code (9,6) and corresponding parity definitions. The encoder may pad fragments/chunks prior to encoding for equal fragment/chunk size. The encoder 100 provides the systematic symbols and the parity symbols for writing to the corresponding ones of the n storage nodes. The encoder 100 also communicates the parity definitions to the parity nodes 105, 107, 109. Deployment of the encoder 100 and specific responsibilities for codeword generation, writing, transmitting, etc., will vary by implementation. A few example implementations will be discussed later.

FIG. 1 depicts the systematic node symbols and the parity information in an arrangement that corresponds to repair row arrangement for ease of understanding. Systematic node $N_0$ hosts a symbol array 111 that includes symbols $a_0$-$a_8$; the systematic node $N_1$ hosts a symbol array 112 that includes symbols $b_0$-$b_8$; the systematic node $N_2$ hosts a symbol array 113 that includes symbols $c_0$-$c_8$; the systematic node $N_3$ hosts a symbol array 114 that includes symbols $d_0$-$d_8$; the systematic node $N_4$ hosts a symbol array 115 that includes $e_0$-$e_8$; and the systematic node $N_5$ hosts the symbol array 116 that includes $f_0$-$f_8$. Each of the parity nodes $P_0$-$P_2$ host parity information that includes parity definitions and parity symbols. The parity node 105, which is identified as $P_0$, hosts a parity definition array 119 and a parity symbols array 121. The parity symbols are depicted as $P_{ti}$, wherein t identifies the parity node and i indicates the row index. Each parity definition array includes a parity definition for each symbol index. For instance, the parity definition array 119 includes a parity definition at index 0 that specifies computation of a sum of the symbols with index 0, $a_0+b_0+c_0+d_0+e_0+f_0$. The "sum," which may vary depending upon implementation, represents the addition of the symbols in a Galois Field (GF) with a fixed size. This sum is stored at entry indexed by 0 in the parity symbols array 121. The parity definitions for $P_0$ are sums of the vector of symbols with index i. With the notation {i} indicating the set of symbols with index i, where i is 0 to 8 in FIG. 1, the parity definition at i for $P_0$ is $\Sigma\{i\}$. In other words, the $P_0$ parity definitions are row parities. The parity definitions for parity node $P_1$ are represented as $P_1F_i$(<symbol set>) and the parity definitions for $P_2$ are represented as $P_2F_i$(<symbol set>). For clarity, the semantic $P_1F_i$( ) does not indicate multiplication of a $P_1$ and $F_i$( ) and $P_2F_i(\ )$ does not indicate multiplication of $P_2$ and $F_i(\ )$. Table 1 below shows example definitions for $P_1$ and $P_2$ with selected coefficients that ensure independence across linear expressions. The coefficients can be randomly selected within the size of the used GF and then validated to ensure the resulting linear expressions remain independent. The coefficients in Table 1 are randomly selected from a GF of size 256, or GF(256).

TABLE 1

Parity Definitions Across Rows

| i | P0 | P1 | P2 |
|---|---|---|---|
| 0 | $\Sigma\{0\}$ | $a_0 + 164b_0 + 152c_0 + 163d_0 + 086e_0 + 084f_0 + a_3 + d_1$ | $a_0 + 143b_0 + 174c_0 + 150d_0 + 096e_0 + 061f_0 + a_6 + d_2$ |
| 1 | $\Sigma\{1\}$ | $a_1 + 191b_1 + 242c_1 + 253d_1 + 250e_1 + 112f_1 + a_4 + e_2$ | $a_1 + 054b_1 + 182c_1 + 197d_1 + 141e_1 + 222f_1 + a_7 + e_0$ |
| 2 | $\Sigma\{2\}$ | $a_2 + 108b_2 + 083c_2 + 021d_2 + 020e_2 + 234f_2 + a_5 + f_0$ | $a_2 + 109b_2 + 018c_2 + 051d_2 + 062e_2 + 227f_2 + a_8 + f_1$ |
| 3 | $\Sigma\{3\}$ | $a_3 + 227b_3 + 046c_3 + 082d_3 + 143e_3 + 032f_3 + b_6 + d_4$ | $a_3 + 181b_3 + 181c_3 + 090d_3 + 208e_3 + 207f_3 + b_0 + d_5$ |
| 4 | $\Sigma\{4\}$ | $a_4 + 087b_4 + 009c_4 + 088d_4 + 040e_4 + 168f_4 + b_7 + e_5$ | $a_4 + 036b_4 + 062c_4 + 040d_4 + 224e_4 + 168f_4 + b_1 + e_3$ |
| 5 | $\Sigma\{5\}$ | $a_5 + 006b_5 + 213c_5 + 209d_5 + 083e_5 + 131f_5 + b_8 + f_3$ | $a_5 + 250b_5 + 151c_5 + 253d_5 + 031e_5 + 225f_5 + b_2 + f4_4$ |
| 6 | $\Sigma\{6\}$ | $a_6 + 120b_6 + 118c_6 + 028d_6 + 154e_6 + 075f_6 + c_0 + d_7$ | $a_7 + 203b_7 + 049c_7 + 067d_7 + 144e_7 + 189f_7 + c_4 + e_6$ |
| 7 | $\Sigma\{7\}$ | $a_7 + 238b_7 + 089c_7 + 062d_7 + 107e_7 + 083f_7 + c_1 + e_8$ | $a_7 + 203b_7 + 049c_7 + 067d_7 + 144e_7 + 189f_7 + c_4 + e_6$ |
| 8 | $\Sigma\{8\}$ | $a_8 + 055b_8 + 214c_8 + 037d_8 + 075e_8 + 105f_8 + c_2 + f_6$ | $a_8 + 160b_8 + 124c_8 + 207d_8 + 210e_8 + 185f_8 + c_5 + f_7$ |

Figure 2:
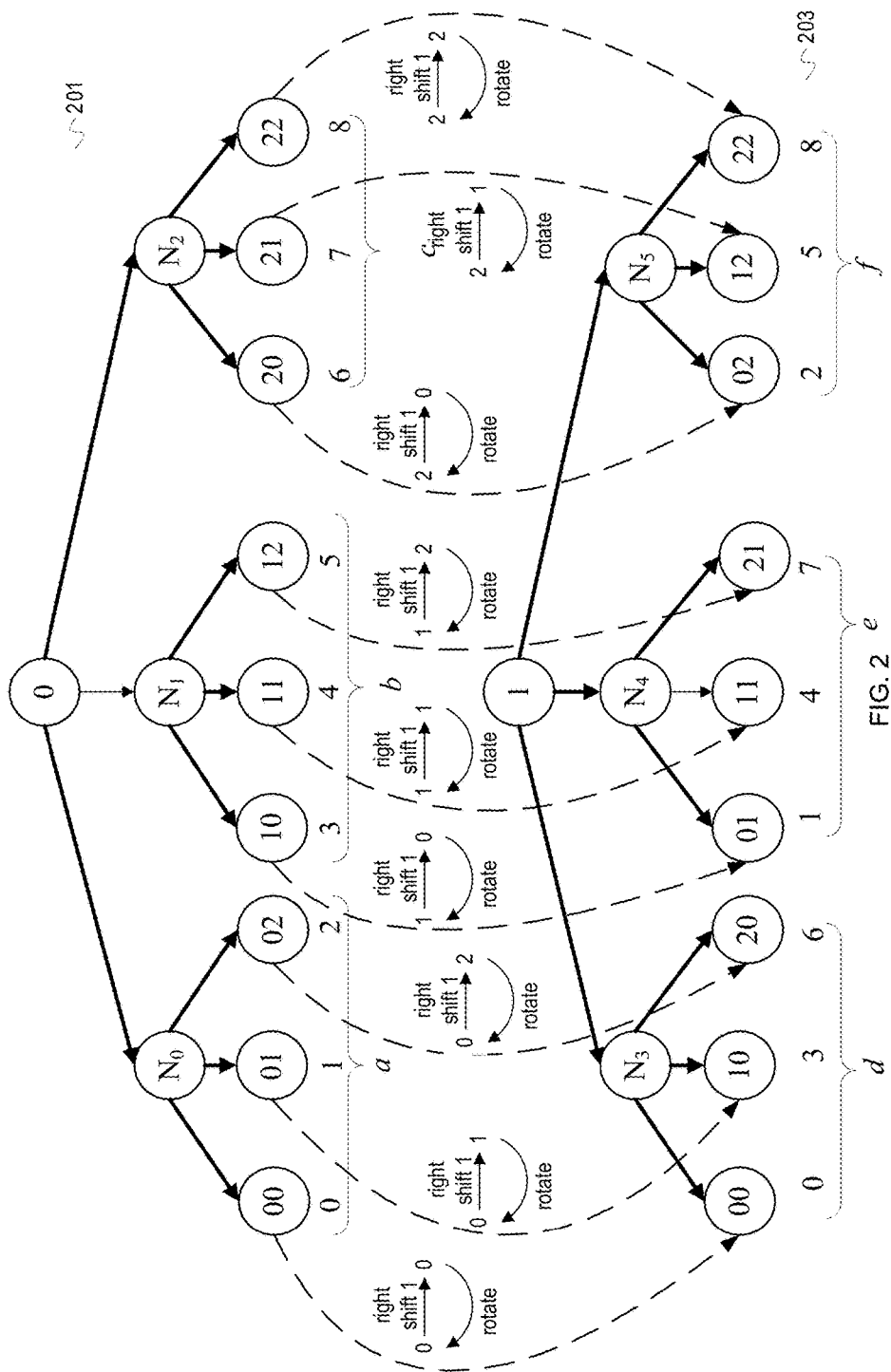
FIG. 2 depicts a diagram of the m r-ary trees 135.
Figure 3:
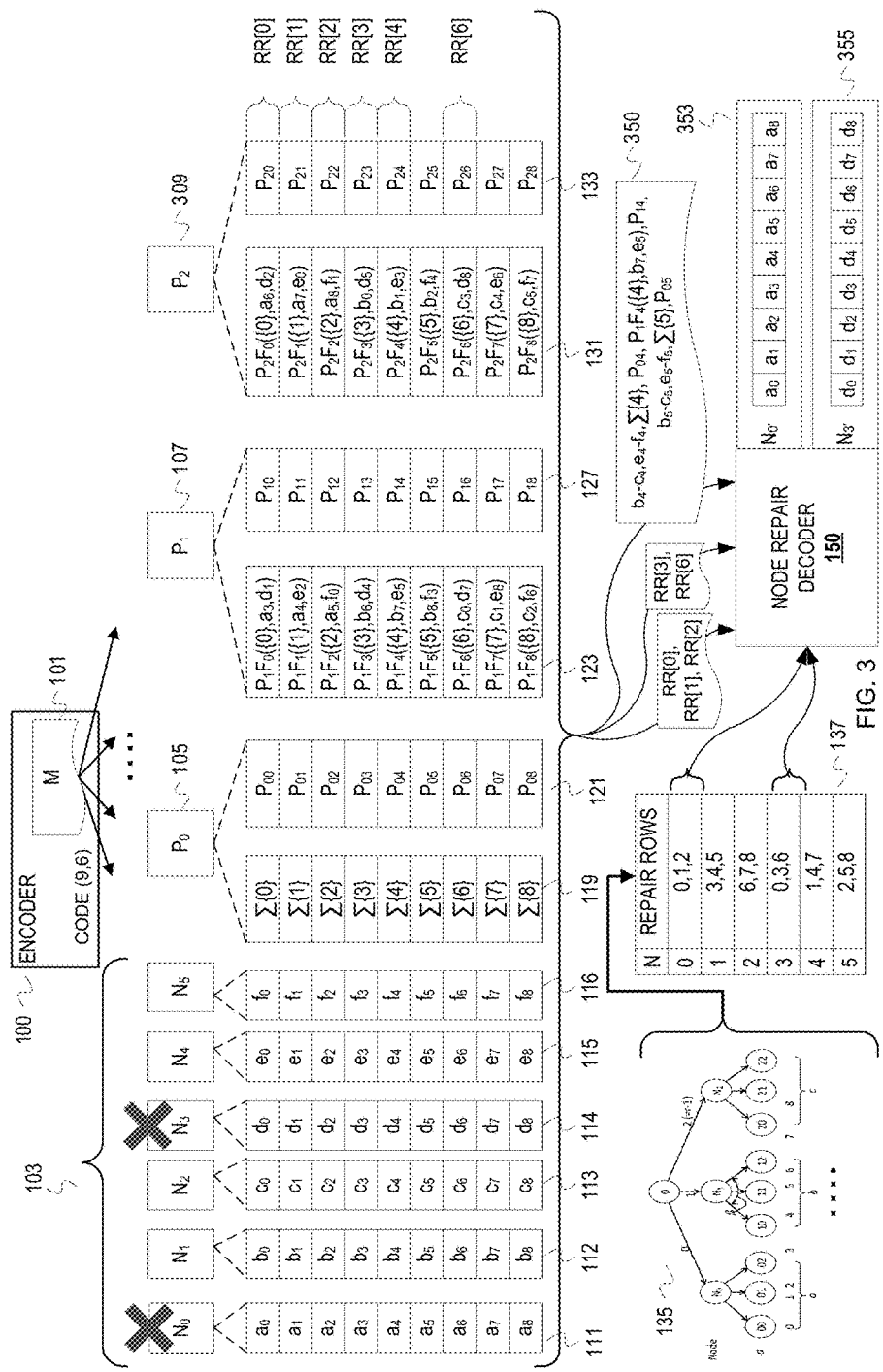
FIG. 3 depicts a diagram of repairing two failed nodes with overlapping repair rows in a distributed storage system using a high rate MSR erasure code.

The set of systematic symbols for the definitions of parity nodes $P_1$ and $P_2$ are determined with m r-ary trees 135. FIG. 2 depicts a diagram of the m r-ary trees 135. Since m=2 and r=3, there are two 3-ary trees. A tree 201 has a root index 0 and a tree 203 has a root index of 1. The second level of the trees represents the storage nodes. In the tree 201, the interior tree nodes at the second level from left to right respectively represent storage nodes $N_0$, $N_1$, and $N_2$. In the tree 203, the interior tree nodes at the second level from left to right respectively represent storage nodes $N_3$, $N_4$, and $N_5$. The leaf nodes of the trees 201, 203 indicate indexes 0-8 in base r, which is base 3 in this example illustration. Each parity definition for $P_1$ and $P_2$ has a symbol set that includes the systematic symbols at the corresponding index and 2 additional systematic symbols. As shown in table 1, the parity definitions for $P_1$ and $P_2$ for i=0 includes all systematic symbols with index 0 ($\{0\}$). The symbol set for the parity definition for P1 when i=0 ($P_1F_0$) also includes the systematic symbols $a_3$ and $d_1$. For $P_2F_0$, the symbol set includes $a_6$ and $d_2$ as well as $\{0\}$. To determine the additional symbols in a parity definition symbol set, an encoder uses the m r-ary trees, which were constructed with a right shift t times and then rotation operation upon digits of the leaf node indexes, where t is the root node index of the tree being constructed. This t right-shift-rotate (RSR) based tree construction establishes symbol set memberships for the linear expressions of the parity definitions. To explain the RSR based tree construction with FIG. 2, the first tree 201 with root index 0 is constructed for the first 3 storage nodes $N_0$-$N_2$, each with 3 leaf nodes—this is based on r=3 and these being r-ary trees. The leaf nodes of the tree 201 indicate the indexes corresponding to the sub-packetization level, thus there are 9 indexes ($r^m$=9). For the tree with root index 0, these are represented in sequential order as depicted in FIG. 2. The tree 201 is depicted with the r-base indexes in the leaf nodes and decimal representation of those indexes beneath. The next tree 203 is constructed based on the tree 201. The root node of the tree 201 is incremented by 1 to set the root node of the tree 203 to 1. The 3 interior nodes of the tree 203 represent the next 3 storage nodes $N_3$-$N_5$. The leaf nodes of the tree 203 are created with index values resulting from applying the already mentioned RSR operation to the leaf nodes of the preceding r-ary tree, which is the tree 201 in this example illustration. For each leaf node of the tree 203, the r-base index indicated in the corresponding leaf node of the tree 201 is right shifted t times (t being the root node index of the tree being created, which is 1 for the tree 203) and then rotated. As shown for the leftmost leaf node of the storage node $N_0$ in the tree 201, the leftmost digit of the index 00 is shifted right 1 position, and then the displaced digit (rightmost digit in this case) is rotated to the position of the shifted digit resulting in the same index 00. For the next leaf node (i.e., the middle leaf node of the storage node $N_3$), the 0 of the index 01 for the storage node $N_0$ is shifted right 1 position and the 1 digit is rotated into the first position to set the index indicated in the middle leaf node of the storage node $N_3$ to 10. Thus, the index 01 becomes 10 for the middle leaf node of the storage node $N_3$. As can be seen in FIG. 3, the indexes with the same digits (i.e., 00, 11, 22) are the same after the RSR operation for base 3 indexes.

In addition to establishing symbol set membership in the parity definitions for the parity nodes, the r-ary trees are used to establish the repair rows for the systematic nodes 103. This repair row information is stored in a repair row table 137 of FIG. 1. A "repair row" is the logical row of information corresponding to the index. Thus, repair row i comprises the information in the ith row of the arrays across the storage nodes depicted in FIG. 1. For instance, repair row 0 (identified as RR[0]) comprises symbols $a_0$-$f_0$, the parity definitions at index 0 of the parity definition arrays 123, 131 ($P_1F_0$ and $P_2F_0$), and the parity symbols at index 0 of parity symbols arrays 127, 133 (i.e., $P_{10}$ and $P_{20}$). The indexes identified by the leaf nodes of the r-ary trees identify the repair row indexes. The tree 201 illustrates (in base 3 form) that the repair rows for $N_0$ are 0, 1, and 2; for $N_1$ are 3, 4, and 5; and for $N_2$ are 6, 7, and 8. The tree 203 illustrates (in base 3 form) that the repair rows for $N_3$ are 0, 3, and 6; for $N_4$ are 1, 4, and 7; and for $N_5$ are 2, 5, and 8. The leaf nodes in tree 201 identify the repair row indexes in sequence based on the systematic symbol indexes 0-8. For construction of each subsequent tree, the digits of the leaf nodes of tree t−1 are shifted right t times and then rotated, t being the root node index of the tree being constructed. For the tree 203, the indexes indicated in the leaf nodes of the tree 201 are shifted right 1 time and then rotated ("RSR" operation). For indexes represented in base 3 with homogenous numbers, the index remains the same. Thus, leaf nodes represented by indexes 00, 11 and 22 remain the same across trees. For the middle leaf node of the $N_3$ subtree, the index 01 indicated by the middle leaf node of the $N_0$ subtree is modified by the RSR operation. The 0 is shifted into the position of the 1 and the 1 is rotated into the position of the 0: 01→10. Thus, the RSR operation results in the middle leaf node for the $N_3$ subtree indicating an index 3 instead of 1. The repair row table 137 as determined by the r-ary trees is reproduced in table 2 below.

TABLE 2

Recovery Rows (RR) for Single Node Failure

| Failed Node | Repair Rows (RR) - Rows to access for Repair/Recovery |
|---|---|
| $N_0$ | 0, 1, 2 |
| $N_1$ | 3, 4, 5 |
| $N_2$ | 6, 7, 8 |
| $N_3$ | 0, 3, 6 |
| $N_4$ | 1, 4, 7 |
| $N_5$ | 2, 5, 8 |

Table 2 specifies the repair rows for a particular node failure. If $N_5$ fails, then the recovery rows 2, 5, and 8 will be accessed to repair $N_5$. If multiple nodes fail, then the recovery rows of the nodes are combined to repair the multiple failed nodes. However, nodes may have overlapping recovery rows. In that case, additional recovery rows are selected because the combined recovery rows will not yield sufficient linear expressions to solve the unknown symbols from the node failures. Overlap of recovery rows occurs when the failed nodes correspond to different ones of the m r-ary trees.

FIG. 1 illustrates a failure of nodes without overlap of recovery rows: $N_0$ and $N_1$. After failure of nodes $N_0$ and $N_1$, a node repair decoder 150 selects replacement nodes N0' 153 and N1' 155 and determines recovery rows to repair the multiple failed storage nodes. With the recovery row table 137, the node repair decoder 150 identifies recovery rows 0-2 based on $N_0$ and recovery rows 3-5 based on $N_1$.

The node repair decoder 150 obtains the information from recovery rows RR[0]-RR[5]. The information from RR[0]-RR[5] include the 24 symbols c-f of indexes 0-5; the 18 parity definitions $\Sigma\{i\}$, $P_1F_i$, $P_1F_i$, with i being 0-5; and the corresponding 18 parity symbols $P_{0i}$, $P_{1i}$ and $P_{2i}$. With the 18 parity definitions, the node repair decoder 150 will form a set of independent linear expressions and solve the expressions to recover $a_0$-$a_8$. The node repair decoder 150 will then write these systematic symbols to the replacement node $N_{0'}$. The node repair decoder 150 then uses the obtained recovery row information along with the recovered symbols $a_0$-$a_8$ to solve the expressions to recover $b_0$-$b_8$. The node repair decoder 150 could solve for the symbols $b_0$-$b_8$ first, and then use those recovered symbols to solve for the symbols $a_0$-$a_8$.

FIG. 3 depicts a diagram of repairing two failed nodes with overlapping recovery rows in a distributed storage system using a high rate MSR erasure code. FIG. 3 depicts the same system as in FIG. 1, but suffering from a failure of $N_0$ and $N_3$. The node repair decoder 150 identifies from the recovery row table 137 recovery rows 0-3 based on $N_0$ failure and recovery rows 0, 3, and 6 based on $N_3$ failure. Since RR[0] occurs in both sets of recovery rows, these recovery rows yield 15 linear expressions to solve 18 unknown symbols, which is insufficient.

To obtain a sufficient number of linear expressions, the node repair decoder 150 selects additional recovery rows. Although the node repair decoder 150 could select any additional recovery row, selection of a recovery row contiguous to an already selected recovery row may be more efficient than a non-contiguous selection (e.g., one read of a sequential memory range that includes RR[0]-[4] instead of multiple reads). Therefore, the node repair decoder 150 selects recovery row RR[4], which is contiguous with RR[3]. With the addition of RR[4], there are 18 linear expressions with $P_0$-$P_3$. However, the 3 additional parity definitions are not sufficient because they only include 2 unknown symbols, so one of the parity definitions is redundant. The symbols set membership of the parity definitions at RR[4] across the parity nodes only encompass unknown symbols $a_4$ and $d_4$. Thus, only 17 independent linear expressions have been obtained. Therefore, the node repair decoder 150 selects RR[5] to obtain a third linear equation to result in 18 independent linear equations to solve for 18 unknown symbols (the total is 18 because the parity information of $P_2$ for RR[4] is not used). The additional information 350 depicts the available systematic symbols at index 4 and parity information at index 4 from parity nodes $P_0$ and $P_1$, and the available systematic symbols at index 4 and parity information at index 5 from $P_0$. Although the node repair decoder 150 could select any 1 of the RR[5] parity definitions from $P_0$-$P_3$, the node repair decoder 150 selects the parity information of $P_0$ since it is most efficient (no coefficients and the definition can be implied since it is row parity). With the sufficient independent linear expressions from RR[0]-RR[6], the node repair decoder 150 writes the recovered symbols $a_0$-$a_8$ to a replacement node $N_{0'}$ 353 and the recovered symbols $d_0$-$d_8$ to a replacement node $N_{3'}$ 355.

Repairing multiple storage nodes with overlapping recovery rows results in a loss of some efficiency since the minimum I/O bound for an MSR erasure code is exceeded. In the example without additional rows (i.e., failed nodes without common recovery rows), 42 symbols are accessed for the repair (24 systematic symbols and 18 parity symbols). In the second case of failed storage nodes with 1 common recovery row, 46 symbols were used for repairing the two failed storage nodes (28 systematic symbols and 18 parity symbols). Although the minimum bound is exceeded, the loss of efficiency is outweighed by making recovery from multiple storage node failures possible.

Figure 4:
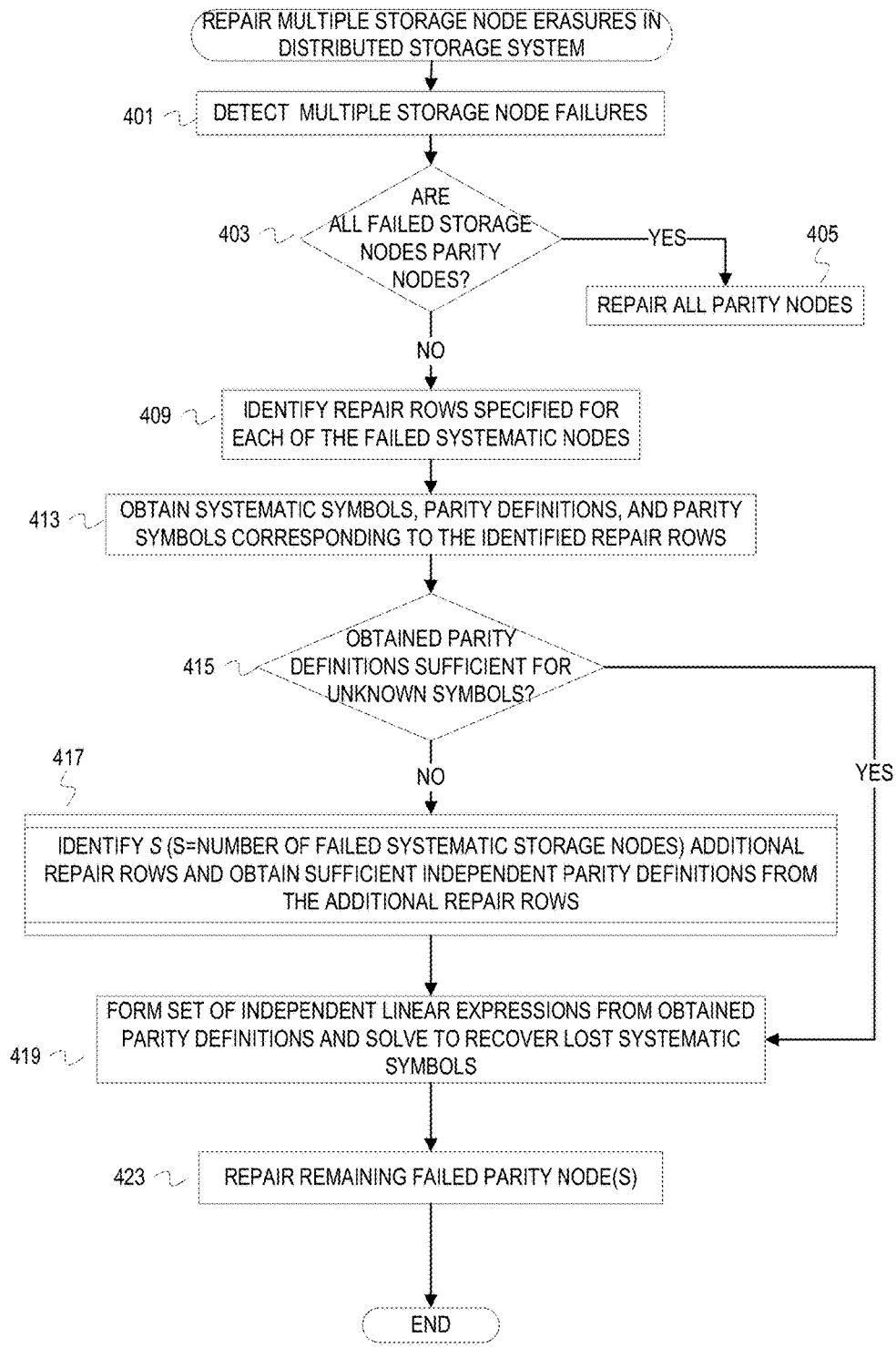
FIG. 4 is a flowchart of example operations for repairing multiple nodes in a distributed storage system with a high rate MSR erasure code.

FIG. 4 is a flowchart of example operations for repairing multiple nodes in a distributed storage system with a high rate MSR erasure code. For consistency with preceding Figures, FIG. 4 refers to a decoder performing the example operations.

At block 401, a decoder detects failure of multiple storage nodes. A storage controller or storage manager may monitor storage nodes for availability. When availability is lost, the storage controller/manager can invoke the decoder to recover the lost symbols. Detection of the failure may be explicit by notification or implicit by invocation. Although multiple storage nodes can fail simultaneously (e.g., a loss of connection to an array of storage nodes or failure of a drive), nodes may also fail at different times. A storage controller/manager may not invoke a decoder immediately in response to detecting loss of availability of a storage node. The storage controller/manager can invoke the decoder based on various criteria. Examples of the criteria include percentage of r nodes that are no longer available (r being n−k), exceeding a threshold number of failures across the distributed storage system, the types of nodes that have failed, etc. This flow presumes that the number of failures does not exceed r, since more than r failed nodes exceeds the capability of the erasure code to recover symbols.

At block 403, the decoder determines whether all of the failed storage nodes are parity nodes. If all of the failed storage nodes are parity nodes, then the decoder repairs all of the parity nodes at block 405. Assuming that the systematic nodes are available, the decoder retrieves the systematic symbols from the systematic nodes and regenerates the parity symbols. The decoder may have access to a store with the parity definitions. The decoder may generate the parity definitions with newly determined coefficients. This would be a functional repair of the parity nodes since an exact repair is constrained to regenerating the same parity definitions. If all of the failed storage nodes are not parity nodes, then control flows to block 409.

At block 409, the decoder identifies the recovery row indexes specified for each of the failed systematic nodes. The identity of recovery rows for each systematic node can be maintained in a data structure in persistent storage. As previously discussed, the recovery row index information for each systematic node is established with the m r-ary trees beforehand, for example before the data is encoded. Since the m r-ary trees are based on the erasure code parameters, the m r-ary trees can be constructed and used in advance to specify recovery row associations for systematic nodes in general when the same erasure code parameters are used.

At block 413, the decoder obtains the systematic symbols, parity definitions, and parity symbols corresponding to the identified recovery row indexes. To obtain this information, the decoder can communicate the recovery row indexes to the helper nodes. In response, the systematic helper nodes will look up the systematic symbols corresponding to the communicated indexes and return those systematic symbols. Similarly, the parity helper nodes will look up the parity symbols and parity definitions corresponding to the communicated indexes and return those to the decoder. Since row parity definitions are sums or additions of a row of symbols, the row parity definition can be hardcoded into the decoder and need not be retrieved or obtained.

At block 415, the decoder determines whether a sufficient number of parity definitions have been obtained to solve the unknown symbols of the failed systematic nodes. If the decoder determines that there is a common recovery row index between the failed systematic nodes, then the parity definitions and parity symbols will be insufficient (i.e., there will not be s independent linear expressions, with s being the number of failed systematic nodes). If there are insufficient parity definitions to recover the lost systematic symbols, then control flows to block 417. Otherwise, control flows to block 419.

At block 417, the decoder identifies s additional recovery rows to obtain sufficient parity definitions to recover the unknown symbols. The decoder can identify recovery rows contiguous to those already identified. The decoder obtains systematic symbols from the systematic nodes corresponding to the additional recovery row indexes. The decoder also obtains the parity information corresponding to the additional recovery row indexes from the parity helper nodes. However, all of the parity definitions from the parity helper nodes may form a set of independent linear expressions sufficient to solve for the unknown symbols. In the case of 2 failed systematic nodes for a (9,6) MSR code with 5 recovery rows identified for the failed systematic nodes, the decoder may select 2 additional recovery rows that comprise 8 additional symbols and 6 additional parity definitions. With the 5 initial recovery rows, the decoder may have only obtained 15 parity definitions which would be insufficient to solve for 18 unknown symbols. But the 2 additional recovery rows yield a total of 21 parity definitions. This exceeds 18, but all 21 parity definitions do not form a set of independent linear expressions sufficient to solve for the 18 unknown symbols. The decoder selects from the parity definitions corresponding to the additional recovery rows to form 18 independent linear expressions to solve and recover the 18 unknown symbols.

At block 419, the decoder forms a set of independent linear expressions from the obtained parity definitions and solves them to recover the lost systematic symbols. The decoder solves the set of independent linear expressions with the obtained symbols. The decoder can then write the recovered symbols to replacement storage nodes. To solve the set of independent linear expressions, calls can be made into a library of functions (e.g., as dot product computation and matrix inversion) via an application programming interface (API). Examples of software libraries for error correction coding related functions include the storage acceleration library, the Jerasure erasure code library, the kodo erasure code library, and the OpenFEC library.

The decoding is based on the encoding. To compute the parity symbols, a dot product function can be used. Each parity symbol is a dot product of systematic symbols and coefficients selected from a Galois Field ($2^8$) or GF(256), which corresponds to 256 bits. Computations of the dot products for all parity symbols can be done in a single call to an API by utilizing advanced vector extensions. Let parity symbols be denoted by:

$P_{ti}$, where $0 \leq t < r$ and $0 \leq i < \alpha$.

The parity $P_{0i}$ ("row parity") is the first symbol of the parity node $P_0$ at the i-th row, and is formed by XORs of systematic symbols of the i-th row. Let these systematic symbols belong to a set $S_i$. The other parity symbols on the i-th row each is formed with m extra systematic symbols (m=k/r) from rows other than the i-th row. Let these symbols form a set $S_{im}$. A buffer with a set of symbols $\{S_i, S_m\}$ is formed as input into a call to a dot product function. A buffer is also allocated for an output with r symbols representing r encoded parity symbols.

To illustrate use of the dot product to create the parity symbols for the first row (i=0), this example will use the HMSR (9, 6). Table 3 below presents the (k+(r−1)*m) or (2k−m) symbols for the dot product. In other words, Table 3 shows the symbol set membership for row 0 across the three parity nodes. The encoding matrix shown in Table 3 has r (i.e. 3) rows corresponding to the parity nodes. Each row of Table 3 indicates the coefficient to be applied to the identified systematic symbol.

TABLE 3

Encoding Matrix to Encode Row 1

| Parity Node | Output Buffer | | | | | | | | | |
|---|---|---|---|---|---|---|---|---|---|---|
| | a1 | b1 | c1 | d1 | e1 | f1 | a4 | e2 | a7 | e0 |
| 0 | 1 | 1 | 1 | 1 | 1 | 1 | 0 | 0 | 0 | 0 |
| 1 | 1 | 191 | 242 | 253 | 250 | 122 | 1 | 1 | 0 | 0 |
| 2 | 1 | 54 | 182 | 197 | 141 | 222 | 0 | 0 | 1 | 1 |

The r dot product results will be copied to an output buffer. An API defined function can compute the r dot products simultaneously by applying AVX2 vectorization.

Before explaining how to solve the set of independent linear expressions to repair multiple failed storage nodes, solving a set of independent linear expressions to repair a single failed node is first addressed. To recover one failed storage node, the number of unknown symbols is $\alpha$. Thus, the number of linear equations to solve for repair of a single failed node is $\alpha$. As per the property of MSR Erasure Code, if the node $N_j$ failed, the a decoder can recover the systematic symbols of $N_j$ by accessing the symbols from $\beta$ rows. That means $\beta$ symbols are to be read from each of the d=n-1 surviving nodes in the repair process. Let $RN_i$ be the set of rows presented by the sub-tree under $N_j$ as represented in the corresponding r-ary tree. If node $N_j$ fails, it can be repaired by reading the symbols of the rows in $RN_i$. The number of linear expressions generated from $\beta$ rows is $\beta r$, which is the same as $\alpha$. Thus the parity symbols from the rows $\in RN_i$ is sufficient to repair $N_j$. For this single failure scenario, it can be presumed that the formed $\alpha$ equations are independent linear equations. This presumption does not necessarily hold true in the multiple failed storage node scenario.

For the dot product function(s) defined by the API and matrix inversion on GF(256), a decoder forms a linear equation system (SEs) with 24 elements using the parity expressions. In the formed linear equation system, 15 symbols are known and 9 symbols are unknown. The decoder generates a matrix that has unit matrix (I) involving 15 known (available) symbols and the rows from 16 to 24 have linear combinations of known symbols and 9 unknown symbols. The decoder then separates a sub-matrix (X) that represents linear combinations of unknown symbols. Let R represent the sub-matrix representing the linear combinations of known symbols. The decoder inverts the sub-matrix X.

changed U→k and X→U

Let $K=\{k_0, k_1, \ldots, k_{14}\}$ be the available symbols,
$U=\{u_0, u_1, \ldots, u_8\}$ be the lost or unknown symbols, and
V=9×9 matrix with coefficients from GF(256).

The linear equations to solve for the lost symbols can be expressed as:

$KI+VU=B.$

Here B is the 1×9 matrix of buffers obtained from the 9 parity symbols. The above linear equations can be solved efficiently using ISAL inversion and dot product functions as: $U=V^{-1}(B-KI)$. The solution for multiple systematic node failures is done using the same approach. For multiple failures, the system of equations involve $s*\alpha$ unknowns to solve, where s is the number of failed systematic nodes. Thus, the size of the matrices would increase.

At block 423, the decoder repairs any remaining failed parity nodes. The decoder can now use the recovered systematic symbols to repair failed parity nodes.

Figure 5:
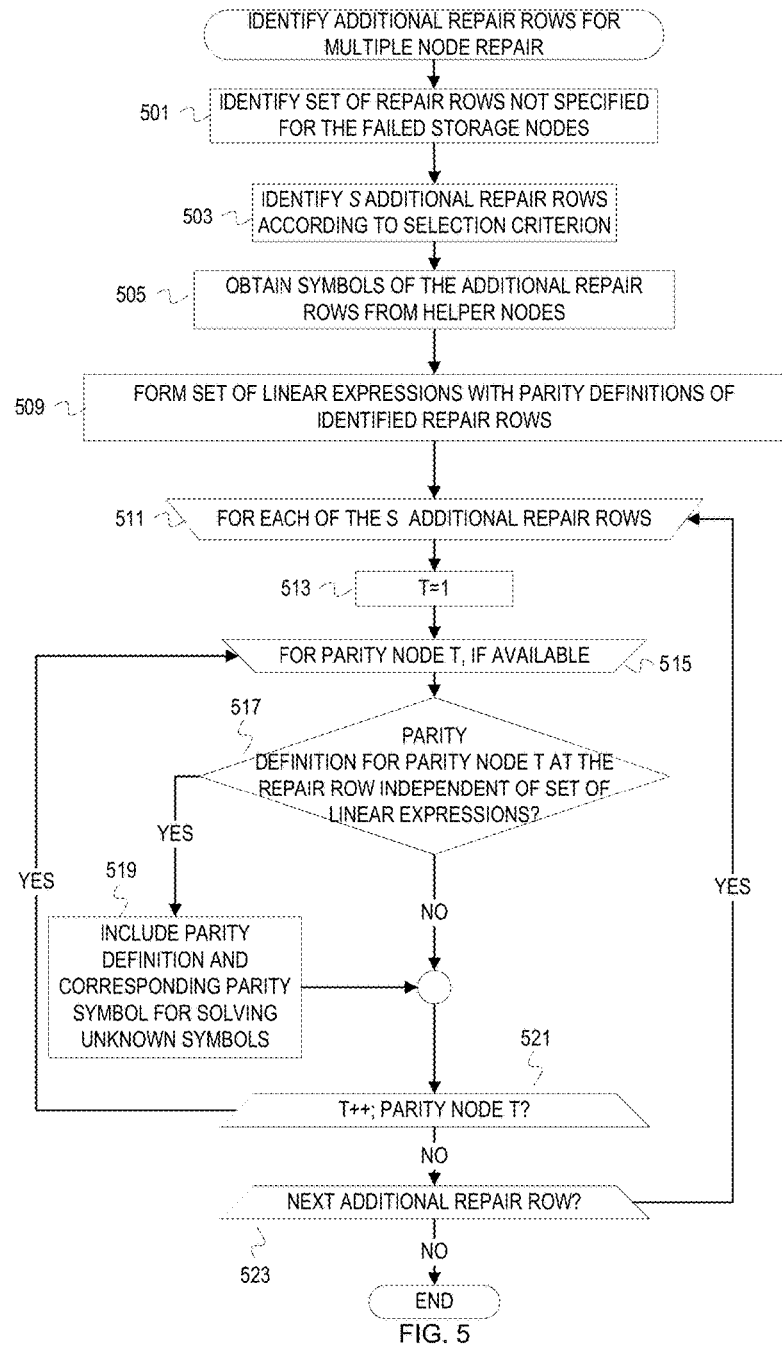
FIG. 5 depicts a flowchart of example operations to identify additional repair rows.

FIG. 5 depicts a flowchart of example operations to identify additional recovery rows. FIG. 5 is an example for performing block 417 of FIG. 4. Again, the figure refers to a decoder as performing the operations for consistency with the preceding figures.

At block 501, the decoder identifies a set of recovery rows that are not specified for the failed storage nodes. In other words, the decoder identifies those recovery rows not specified for the failed storage nodes.

At block 503, the decoder identifies s additional recovery rows from the identified set of recovery rows according to a selection criterion. As previously indicated, s indicates the number of failed storage nodes. A selection criterion can be defined to increase access efficiency. For instance, the selection criterion may specify that selection be biased toward recovery row indexes that are contiguous (i.e., sequential) with the already identified recovery row indexes.

At block 505, the decoder obtains symbols of the additional recovery rows from the helper nodes. The decoder communicates the indexes of the additional recovery rows to the systematic helper nodes. In response, the systematic helper nodes communicate the systematic symbols of the communicated indexes. Likewise, the decoder communicates the indexes of the additional recovery rows to the parity helper nodes. In response, the parity helper nodes communicate the parity information of the communicated indexes.

At block 509, the decoder forms a set of linear expressions with the parity definitions of the recovery rows already identified for the failed storage nodes. This set does not include the parity definitions of the identified additional recovery rows. The decoder will use the set of linear expressions to select from the parity definitions of the additional recovery rows if independence is maintained.

At block 511, the decoder begins evaluating parity definitions corresponding to each of the s additional recovery row indexes. The decoder will select each parity definition of each parity helper node for each additional recovery row.

At block 513, the decoder sets T to the value 1. The variable T is used to index the parity node. The decoder defaults to including row parity definitions as independent linear expressions into the linear expressions and the decoder operates as if the parity definition for parity node 0 is row parity.

At block 515, the decoder begins traversing the parity definitions by parity helper node. Parity helper node is specified because a parity node may not be available if it is one of the failed storage nodes.

At block 517, the decoder determines whether the parity definition for parity node T at the currently selected one of the additional recovery rows is independent of the set of linear expressions. If the parity definition is independent with respect to the set of linear expressions, then control flows to block 519. Otherwise, control flows to block 521.

At block 519, the decoder includes the parity definition for parity node T at the currently selected one of the additional recovery row indexes into the set of linear expressions. The decoder also incorporates the corresponding parity symbol into the linear expression set for solving the unknown symbols. Control continues from block 519 to 521.

At block 521, the decoder increment the parity node index T and determines whether there is an available node T. If there is an available parity node T, then control returns to block 515. If not, then control flows to block 523. At block 523, the decoder determines whether there is a next additional recovery row. If so, control returns to block 511.

Figure 6:
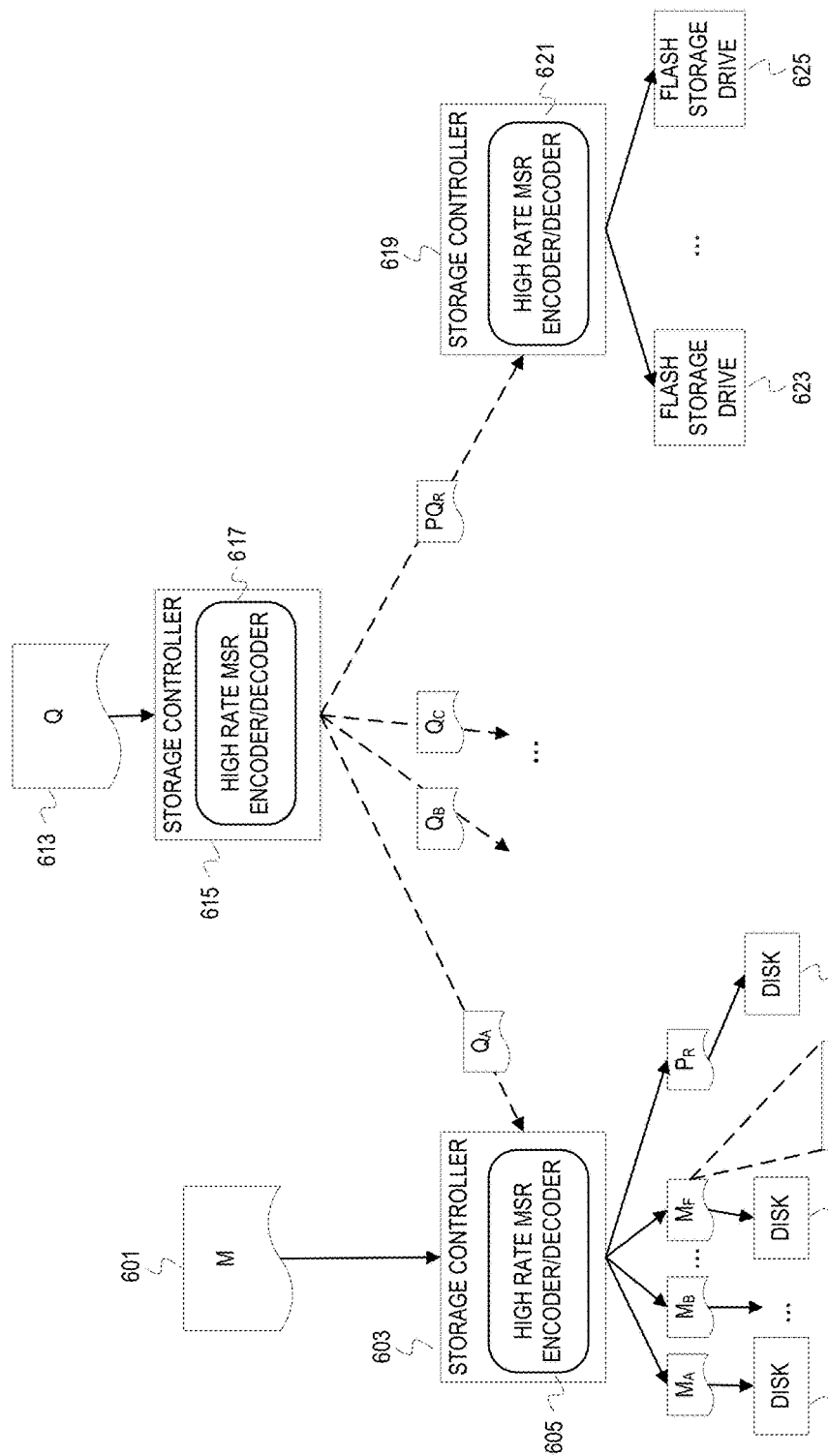
FIG. 6 depicts a diagram of alternative deployments of a high rate MSR encoder/decoder in different distributed storage systems.

FIG. 6 depicts a diagram of alternative deployments of a high rate MSR encoder/decoder in different distributed storage systems. For a first case, a distributed storage system comprises a storage controller 603 and a storage controller 619. A dataset (e.g., file) can be ingested into either one of the storage controllers. The storage controller 603 includes a high rate MSR encoder/decoder 605, and manages access to disks (i.e., storage nodes) 607, 609, 610. The storage controller 619 includes a high rate MSR encoder/decoder 621, and manages access to flash storage drives (i.e., storage nodes) 623, 625. Since a dataset can be ingested into either one of the storage controllers, the illustration of the first case refers to one of the storage controllers. The storage controller 603 receives a file 601 (identified as M) from a client, for example. The storage controller 603 uses the high rate MSR encoder/decoder 605 to encode the file 601 into systematic symbol vectors $M_A$-$M_F$ and parity symbol vectors, one of which is depicted as $P_R$. The storage controller 603 writes each of the symbol vectors to a different disk. The same would be done for a different file ingested at the storage controller 619.

For a second case, the distributed storage system has a hierarchy of storage systems. A storage controller 615 distributes symbols vectors across storage controllers of the storage system, which includes the storage controllers 603, 619. The storage controller 615 receives a file "Q" 613. The storage controller 615 uses a high rate MSR encoder/decoder 617 to encode the file 613 into systematic symbol vectors $Q_A$-$Q_F$ and parity symbol vectors, one of which is depicted as $PQ_R$. The receiving storage controllers 603, 619 write the symbol vectors to their storage nodes without further encoding. For a recovery, the storage controller 615 can retrieve information for recovery from across the distributed storage system.

Variations

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in blocks 413 and 415 can be performed in a different order. Embodiments can determine whether the initially identified recovery rows are sufficient, and then identify additional recovery rows before obtaining symbols. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

Figure 7:
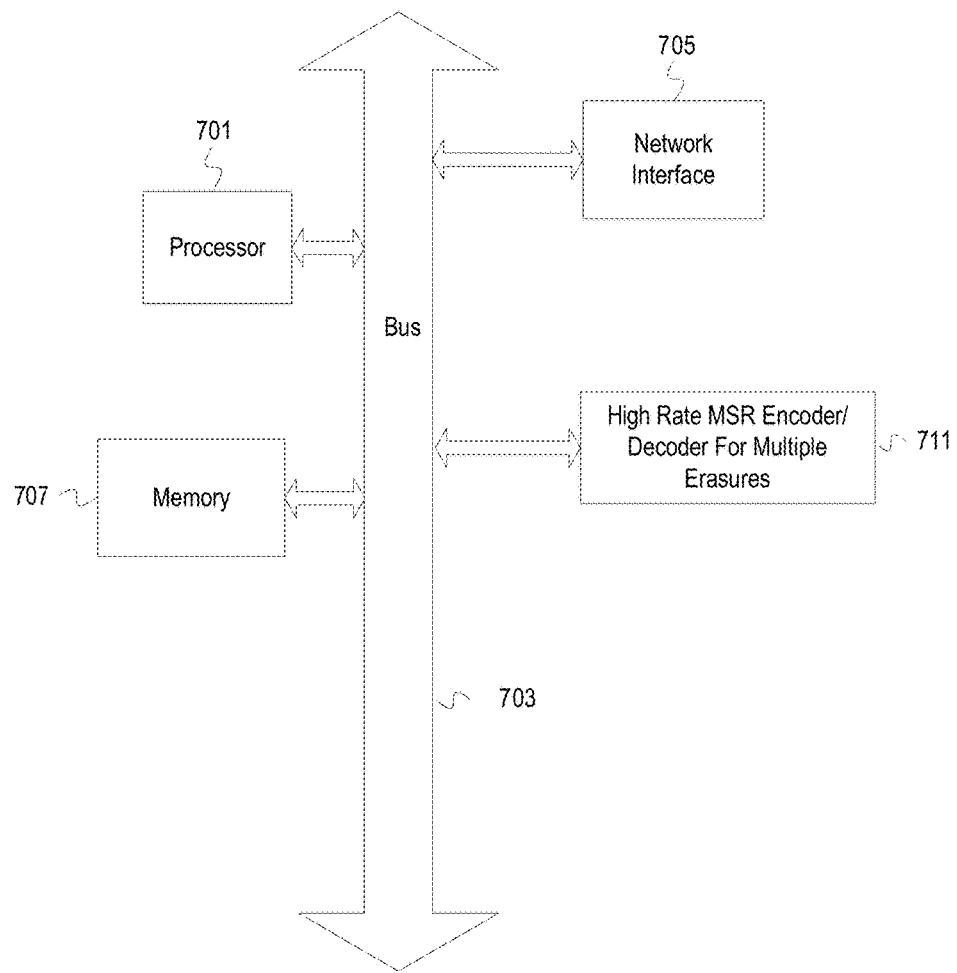
FIG. 7 depicts an example computer system with a high rate MSR encoder/decoder for repairing multiple failed storage nodes.

FIG. 7 depicts an example computer system with a high rate MSR encoder/decoder for repairing multiple failed storage nodes. The computer system includes a processor 701 (possibly including multiple processors, multiple cores, multiple nodes, and/or implementing multi-threading, etc.). The computer system includes memory 707. The memory 707 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 703 (e.g., PCI, ISA, PCI-Express, Hyper-Transport® bus, InfiniBand® bus, NuBus, etc.) and a network interface 705 (e.g., a Fiber Channel interface, an Ethernet interface, an internet small computer system interface, SONET interface, wireless interface, etc.). The system also includes a high rate MSR encoder/decoder 711 for repairing multiple failed storage nodes. The high rate MSR encoder/decoder 711 recovers unknown symbols from multiple erasures in distributed storage system. Any one of the previously described functionalities may be partially (or entirely) implemented in hardware and/or on the processor 701. For example, the functionality may be implemented with an application specific integrated circuit, in logic implemented in the processor 701, in a co-processor on a peripheral device or card, etc. Further, realizations may include fewer or additional components not illustrated in FIG. 7 (e.g., video cards, audio cards, additional network interfaces, peripheral devices, etc.). The processor 701 and the network interface 705 are coupled to the bus 703. Although illustrated as being coupled to the bus 703, the memory 707 may be coupled to the processor 701.

While the aspects of the disclosure are described with reference to various implementations and exploitations, it will be understood that these aspects are illustrative and that the scope of the claims is not limited to them. In general, techniques for recovering from multiple erasures or storage node failures in a distributed storage system using a high rate MSR erasure code as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

What is claimed is:

1. A method comprising:
   after detection of unavailability of multiple systematic storage nodes that host systematic symbols of a file stored in a distributed storage system according to a high rate minimum storage regeneration erasure code, identifying a first plurality of indexes specified for the multiple systematic storage nodes, wherein a set of r indexes of the first plurality of indexes is specified for each of the multiple systematic storage nodes, wherein r is a number of parity storage nodes for the file;
   based on a determination that at least one index of the first plurality of indexes was common across at least two of the multiple systematic storage nodes,
      determining at least s additional indexes that are not one of the first plurality of indexes, wherein s is a number of the multiple systematic storage nodes;
      obtaining systematic symbols corresponding to the first plurality of indexes and the determined s additional indexes from available systematic storage nodes;
      obtaining parity definitions and parity symbols corresponding to the first plurality of indexes and the determined s additional indexes from available parity storage nodes; and
      recovering the systematic symbols that were hosted on the unavailable systematic storage nodes based, at least in part, on the parity definitions and the obtained systematic symbols and parity symbols.

2. The method of claim 1, wherein n is a total number of storage nodes for the file, k is a total number of systematic storage nodes for the file, and k/n>0.5.

3. The method of claim 1 further comprising:
   based on a determination of no commonality of indexes across the multiple systematic storage nodes,
      obtaining parity definitions and parity symbols corresponding to the first plurality of indexes from available parity storage nodes corresponding to the file.

4. The method of claim 1 further comprising:
   for each systematic storage node of the file, specifying r indexes for recovering unknown symbols in response to the systematic storage node becoming unavailable.

5. The method of claim 1, further comprising:
   specifying indexes for a systematic storage node $N_j$ as r indexes indicated in a leaf nodes of a sub-tree t of a r-ary tree with root index i, wherein $0 \leq j < k$, $t = j$ modulo r, and i is an integer quotient of j/r.

6. The method of claim 1 further comprising storing indexes by systematic node identifier for retrieval in response to detecting multiple failures.

7. The method of claim 1, wherein recovering the systematic symbols comprises:
   forming a first set of independent linear expressions with the parity definitions corresponding to the first plurality of indexes.

8. The method of claim 1, wherein obtaining parity definitions and parity symbols corresponding to the first plurality of indexes and the determined s additional indexes from available parity storage nodes comprises obtaining the parity definitions and the parity symbols until sufficient parity definitions have been obtained to recover the systematic symbols that were hosted on the multiple storage nodes.

9. The method of claim 1, wherein obtaining systematic symbols corresponding to the first plurality of indexes and the determined s additional indexes from available systematic storage nodes comprises communicating a request for the systematic symbols to storage controllers managing the available systematic storage nodes.

10. A non-transitory machine readable medium having stored thereon instructions for performing a method for recovering multiple symbol array erasures in a distributed storage system with a high rate minimum storage regenerating erasure code comprising machine executable code which when executed by at least one machine, causes the machine to:
   after detection of erasure at s systematic symbol arrays for a file encoded into k systematic symbol arrays and r parity symbol arrays, where s is less than or equal to r and k/r>0.5, wherein each of the k systematic symbol arrays and each of the r parity symbol arrays is hosted at a storage node in the distributed storage system,
   for each of the s systematic symbol arrays, identify a set of r indexes specified for recovery of the systematic symbol array;
   based on a determination that at least one index is common across at least two of the sets of r indexes, determine at least s additional indexes that are not one of the sets of r indexes;

obtain systematic symbols corresponding to the sets of r indexes and to the determined s additional indexes from the storage nodes that are available and that host systematic symbol arrays;

obtain parity definitions and parity symbols corresponding to the sets of r indexes and the determined s additional indexes from the storage nodes that are available and that host parity symbol arrays; and recover the s systematic symbol arrays based, at least in part, on the parity definitions, the obtained systematic symbols, and the obtained parity symbols.

11. The machine-readable storage medium of claim 10, further comprising code to:

based on a determination of no overlap among the s sets of the r indexes, obtain parity definitions and parity symbols corresponding to the sets of r indexes from the storage nodes that are available and that host parity symbol arrays.

12. The machine-readable storage medium of claim 10, wherein the code to determine at least s additional indexes comprises program code to identify indexes contiguous with at least one of the sets of r indexes.

13. The machine-readable storage medium of claim 10, wherein the code to obtain parity definitions and parity symbols corresponding to the determined s additional indexes comprises code to select at least one parity definition and corresponding parity symbol at each of the determined s additional indexes, from each of the r symbols arrays that are available, up to a sufficient number of parity definitions and parity symbols to form s*k independent linear equations.

14. The machine-readable storage medium of claim 10, further comprising code to at least select the row parity symbols at the s additional indexes.

15. A computing device comprising:

a memory containing machine readable medium comprising machine executable code having stored thereon instructions for performing a method of recovering data; and a processor coupled to the memory, the processor configured to execute the machine executable code to cause the processor to:

after detection of unavailability of multiple systematic storage nodes that host systematic symbols of a file stored in a distributed storage system according to a high rate minimum storage regeneration erasure code, identify a first plurality of indexes specified for the multiple systematic storage nodes, wherein a set of r indexes of the plurality of indexes is specified for each of the multiple systematic storage nodes, wherein r is a number of parity storage nodes for the file;

based on a determination that at least one index of the first plurality of indexes was common across at least two of the multiple systematic storage nodes, determine at least s additional indexes that are not one of the first plurality of indexes, wherein s is a number of the multiple systematic storage nodes;

obtain systematic symbols corresponding to the first plurality of indexes and the determined s additional indexes from available systematic storage nodes;

obtain parity definitions and parity symbols corresponding to the first plurality of indexes and the determined s additional indexes from available parity storage nodes; and recover the systematic symbols that were hosted on the unavailable systematic storage nodes based, at least in part, on the parity definitions, the obtained systematic symbols and the obtained parity symbols.

16. The computing device of claim 15, wherein n is a total number of storage nodes for the file, k is a total number of systematic storage nodes for the file, and k/n>0.5.

17. The computing device of claim 15, wherein the machine-readable medium further comprises code executable by the processor to cause the processor to:

based on a determination of no commonality of indexes across the multiple systematic storage nodes, obtain parity definitions and parity symbols corresponding to the first plurality of indexes from available parity storage nodes corresponding to the file.

18. The computing device of claim 15, wherein the machine-readable medium further comprises code executable by the processor to cause the processor to:

for each systematic storage node of the file, specify r indexes for recovering unknown symbols in response to the systematic storage node becoming unavailable.

19. The computing device of claim 15, further comprising code to:

specify indexes for a systematic storage node $N_j$ as r indexes indicated in a leaf nodes of a sub-tree t of a r-ary tree with root index i, wherein $0 \leq j < k$, $t = j$ modulo r, and i is an integer quotient of j/r.

20. The computing device of claim 15, wherein the machine-readable medium further comprises code executable by the processor to cause the processor to store specified indexes by systematic node identifier for retrieval in response to detecting multiple failures.

* * * * *